United States Patent
Zhang et al.

(10) Patent No.: US 11,923,470 B2
(45) Date of Patent: Mar. 5, 2024

(54) VISIBLE-SWIR HYPER SPECTRAL PHOTODETECTORS WITH REDUCED DARK CURRENT

(71) Applicant: Sensors Unlimited, Inc., Princeton, NJ (US)

(72) Inventors: Wei Zhang, Princeton, NJ (US); Douglas Stewart Malchow, Lawrence, NJ (US); Michael J. Evans, Yardley, PA (US); Paul L. Bereznycky, Medford, NJ (US); Sean T. Houlihan, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 17/972,047

(22) Filed: Oct. 24, 2022

(65) Prior Publication Data

US 2023/0050990 A1 Feb. 16, 2023

Related U.S. Application Data

(63) Continuation of application No. 16/593,793, filed on Oct. 4, 2019, now abandoned.

(51) Int. Cl.
*H01L 31/0304* (2006.01)
*H01L 21/304* (2006.01)
*H01L 21/3065* (2006.01)
*H01L 31/0232* (2014.01)
*H01L 31/101* (2006.01)
(Continued)

(52) U.S. Cl.
CPC ...... *H01L 31/03046* (2013.01); *H01L 21/304* (2013.01); *H01L 21/3065* (2013.01); *H01L 31/02327* (2013.01); *H01L 31/101* (2013.01); *H01L 31/1844* (2013.01)

(58) Field of Classification Search
CPC ............ H01L 31/03046; H01L 21/304; H01L 21/3065; H01L 31/02327; H01L 31/101; H01L 31/1844; H01L 31/109; H01L 31/0693; H01L 31/0735; H01L 31/1013; H01L 51/447; H01L 27/14665–14676
See application file for complete search history.

(56) References Cited

U.S. PATENT DOCUMENTS 7,081,415 B2  7/2006  Wang
9,130,083 B2  9/2015  Yoneda et al.
(Continued)

FOREIGN PATENT DOCUMENTS

KR    1393080    5/2014

OTHER PUBLICATIONS

Extended European Search Report dated Jun. 16, 2020, issued duriing the prosecution of European Patent Application No. EP 19214976.3.

(Continued)

*Primary Examiner* — Mohammad A Rahman
(74) *Attorney, Agent, or Firm* — Locke Lord LLP; Joshua L. Jones; Scott D. Wofsy

(57) ABSTRACT

A method includes forming an assembly of layers including an InP cap layer on an InGaAs absorption region layer, wherein the InGaAs layer is on an n-InP layer, and wherein an underlying substrate layer underlies the n-InP layer. The method includes removing a portion of the InP cap and n-InP layer by dry etching.

11 Claims, 2 Drawing Sheets

(51) Int. Cl.
    *H01L 31/08*   (2006.01)
    *H01L 31/18*   (2006.01)

(56) References Cited

U.S. PATENT DOCUMENTS

| | | |
|---|---|---|
| 9,831,313 B2 | 11/2017 | Zhang et al. |
| 2004/0188787 A1 | 9/2004 | Yang |
| 2004/0259287 A1* | 12/2004 | Suhara ............... H01L 31/1035 438/93 |
| 2008/0211871 A1* | 9/2008 | Sakurai ................. B41J 2/1433 29/890.1 |
| 2008/0308891 A1 | 12/2008 | Boisvert |
| 2010/0301437 A1 | 12/2010 | Brown |
| 2012/0168720 A1 | 7/2012 | Akita |
| 2013/0010824 A1 | 1/2013 | Okumura |
| 2014/0054545 A1 | 2/2014 | Akita |

OTHER PUBLICATIONS

Kagawa S. et al., "Wide-Wavelength INGAAS/INP Pin Photodiodes Sensitive Fron 0.7 TO 1.6 UM", Japanese Journal of Applied Physics. Japan Society of Applied Physics, vol. 28, No. 10, Part 01, Oct. 1, 1989, pp. 1843-1846.

Ban V S et al., "Large Area, High Performance INP/INGAAS/INP Detectors Responding in the 500 to 1700 NM Spectral Range", Proceedings of the International Conference on Indium Phosphide and Related Materials, Cardiff, Apr. 8-11, 1991; vol. CONF. 3, Apr. 8, 1991, p. 27.

Hieronymi F, et al., "High-Performance MSM Photodetectors on Semiinsulating InP:Fe/InGaAs: Fe/Inp:Fe", Proceedings of the International Conference on Indium Phosphide and Related Materials, Apr. 21-24, 1992, pp. 561-564.

Chen Hsin-Yi, et al., "Inductively Coupled Plasma Etching Of InP Using CH4/H2 and CH4/H2/N2", Journal of Vacuum Science and Technology, Part B, AVS/AIP, vol. 20, No. 1, Jan. 1, 2002, pp. 47-52.

* cited by examiner

VISIBLE-SWIR HYPER SPECTRAL PHOTODETECTORS WITH REDUCED DARK CURRENT

CROSS-REFERENCE TO RELATED APPLICATIONS

This is a divisional of U.S. patent application Ser. No. 16/593,793 filed Oct. 4, 2019 the content of which is incorporated by reference herein in its entirety.

BACKGROUND

1. Field

The present disclosure relates to photodetectors, and more particularly to wide bandwidth hyper spectral photodetectors, e.g., for use in hyper spectral imaging.

2. Description of Related Art

Photodetectors with InGaAs lattice-matched to InP require smooth surfaces for adequate light admission, high quality interface for passivation, and require small diode areas to reduce dark current. Traditionally, a front InP cap is in the micron to sub-micron thickness range. Lateral diffusion in the cap increases the junction area and thus increases dark current.

The conventional techniques have been considered satisfactory for their intended purpose. However, there is an ever present need for improved systems and methods for hyper spectral imaging with low dark current. This disclosure provides a solution for this need.

SUMMARY

A method includes forming an assembly of layers including an InP cap layer on an InGaAs absorption region layer, wherein the InGaAs layer is on an n-InP layer, and wherein an underlying substrate layer underlies the n-InP layer. The method includes removing a portion of the InP cap layer by dry etching.

The method can include growing the InP cap layer epitaxially on the InGaAs absorption region layer. The method can include chemical polishing and/or mechanical polishing of the InP substrate layer to remove on the order of hundreds of microns of thickness from the InP substrate layer prior to removing InP and InGaAs etch-stop layers by selective wet etching, and then a portion of the InP cap layer by dry etching.

Dry etching can include removing only on the order of nanometers of the InP cap layer and substrate layer. Dry etching can include dry etching the InP cap layer and substrate layer down to a thickness that gives the assembly of layers sensitivity down into visible light wavelengths for hyper spectral imaging. The final thickness of InP can be tailored by Inductive Coupled Plasma (ICP) dry etch to a thickness range from below 200 nm, down to 10 nm with good surface quality comparable to epitaxial growth. Dry etching can include ICP etching. The ICP can be a chlorine free process.

The method can include forming a dielectric passivation layer on the InP cap layer after removing the portion of the InP cap layer by dry etching. The method can include forming a diffusion area in the InP cap layer and InGaAs absorption region layer to form a photodiode.

The n-InP layer can be a contact layer. The method can include removing the substrate layer and dry etching a portion of the n-InP layer away. Dry etching a portion of the n-InP layer away can include dry etching the n-InP layer down to a final thickness that ranges from below 200 nm, down to 10 nm. The method can include forming a multiple layer backside anti-reflective coating on the n-InP layer.

A photodiode system includes InP cap layer on an InGaAs absorption region layer, wherein the InGaAs layer is on an n-InP layer. For front illuminated detectors the thinned the InP cap layer can be sensitive down into visible light wavelengths desired for Visible to SWIR hyper spectral imaging. Reducing the InP cap layer thickness can reduce the lateral diffusion thus reducing the dark current. This can also favor fine pixel pitch fabrication due to the reduced lateral diffusion. The InP cap layer can range from below 200 nm, down to 10 nm in thickness.

The InP cap layer and InGaAs absorption region layer can include a diffusion area. The InP cap layer and InGaAs absorption layer can have an inherent dark current which can be reduced by this thinned InP cap layer. An underlying substrate layer can underlie the n-InP layer. The system can include a dielectric passivation layer on the InP cap layer.

For back illuminated detectors, the InP cap layer and InGaAs absorption region layer can include a diffusion area. The InP cap layer and the InGaAs absorption layer can have an inherent dark current which can be reduced by this thinned InP cap layer. The n-InP layer can have a thickness of less than or equal to hundreds of nm achieved by this substrate thinning technique finishing with dry etch. The system can include a multiple layer backside anti-reflective coating on the n-InP layer.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
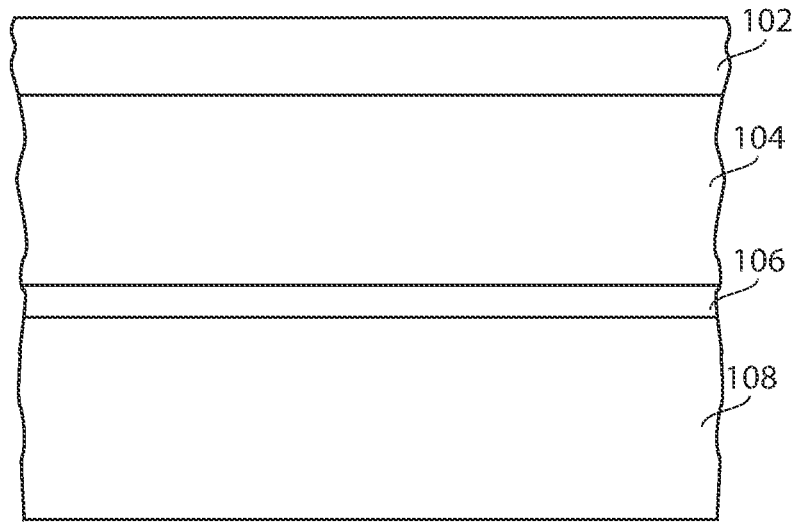
FIG. 1 is a schematic cross-sectional side elevation view of an embodiment of a system constructed in accordance with the present disclosure, showing the InP cap layer before reducing thickness thereof.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-4, as will be described. The systems and methods described herein can be used to form hyper spectral photodetectors, e.g. for use in focal plane arrays or the like.

A method includes forming an assembly 100 of layers including an InP cap layer 102 on an InGaAs absorption region layer 104, which is in turn on an n-InP layer 106. An underlying substrate layer 108 underlies the n-InP layer 106, which is a buffer layer. The InP cap layer 102 can be grown epitaxially on the InGaAs absorption region layer 104.

The method can include dry etching of the InP cap layer 102 to remove on the order of hundreds of nanometers of thickness from the InP cap layer, while still leaving a smooth, thin layer for the subsequent passivation and contact steps. The dry etching process can include inductive coupled plasma (ICP) etching, and the ICP can be a chlorine free process.

Figure 2:
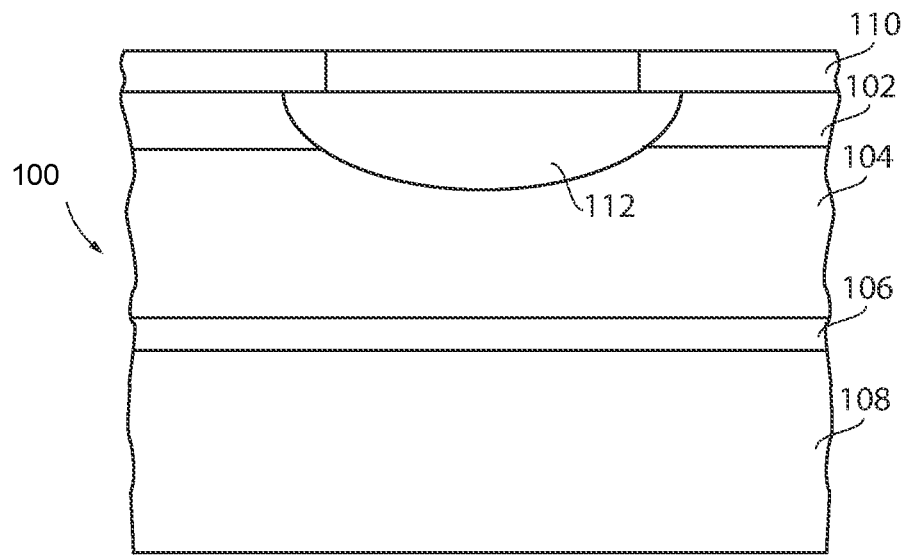
FIG. 2 is a schematic cross-sectional side elevation view of the system of FIG. 1, showing the InP cap layer after reducing the thickness thereof, in a configuration for front side illumination sensitivity.

With reference now to FIG. 2, after the InP cap layer 102 has been thinned by dry etching, the method can include forming a dielectric passivation layer 110 on the InP cap layer 102. The method can include forming a diffusion area 112 in the InP cap layer 102 and InGaAs absorption region layer 104 to form a photodiode.

InP absorbs wavelengths shorter than 920 nm, so in traditional systems photosensitivity is limited to infrared when using InP. Absorption increases with InP substrate thickness. Reducing the InP cap thickness will decrease a device's dark current, while reduction of the substrate and or/InP cap allows improved sensitivity to shorter wavelengths of light. The processes described herein allow for reliable thinning of the InP cap layer 102 (with reliable control of thickness and surface smoothness) down until the InP cap layer 102 is thin enough to allow sensitivity in visible wavelengths due to incomplete absorption below 920 nm. The InP cap layer 102 is can be less than or equal to one hundred nanometers thick, which allows for sensitivity down into visible light wavelengths for hyper spectral imaging. The InP cap layer 102 and InGaAs absorption layer 104 can have an inherent dark current that is reduced due to the thinned InP cap layer thickness, in which the corresponding lateral diffusion area is also decreased. The stacking defects at the InP surface can be removed through dry etching, which improves the epitaxial surface and further reduces dark current by removing leaky paths.

The description above with respect to FIGS. 1 and 2 provides a system and process for front side illumination structures, i.e. where the system 100 in FIG. 2 is sensitive to illumination from above as oriented in FIG. 2.

Figure 3:
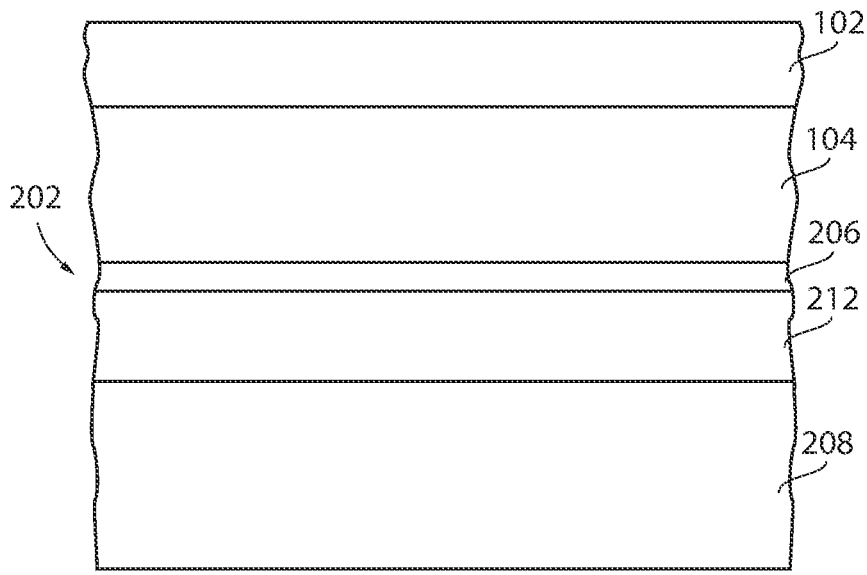
FIG. 3 is a schematic cross-sectional side elevation view of an embodiment of a system constructed in accordance with the present disclosure, showing a back-side illumination configuration prior to reducing thickness of the InP cap layer and prior to reducing thickness of the contact layer.
Figure 4:
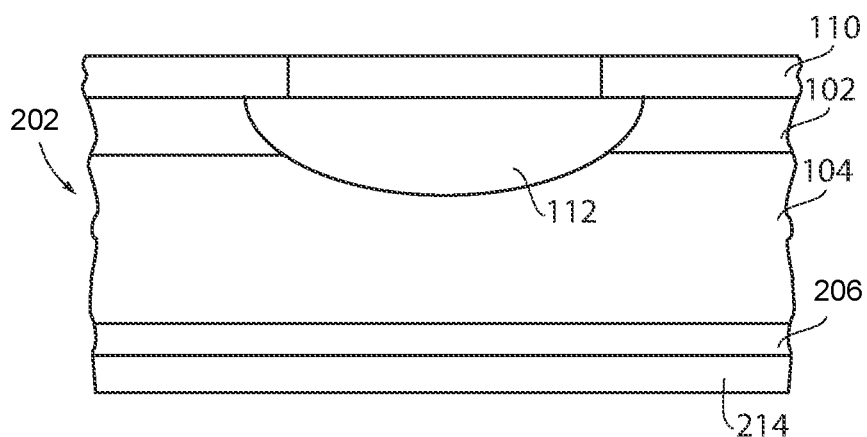
FIG. 4 is a schematic cross-sectional side elevation view of the system of FIG. 3, showing the InP cap layer and the contact layer after reduction of their thicknesses.

With reference now to FIG. 4, for back side illumination, a system 200 includes an assembly of layers 202 including an InP cap layer 102 and an InGaAs absorption region layer 104 similar to those described above. The n-InP layer 206 is similar to the layer 106 described above, but is a contact layer in this application. The method includes removing material from the InP cap layer 102 for dark current reduction, depositing a dielectric passivation layer 110, and forming a diffusion area 112 as described above with respect to FIGS. 1 and 2. The method can also include removing the substrate layer 208 through chemical mechanical lapping and polishing followed by selective wet etching and selective wet etching the InGaAs sacrificial layer 212 away as shown in FIGS. 3-4. Dry etching a portion of the n-InP contact layer 206 away can include dry etching the n-InP contact layer 206 down to a final thickness from below 200 nm, down to 10 nm thick. The method can include forming a multiple layer backside anti-reflective (AR) coating 214 on the n-InP layer. This system as shown in FIG. 4 is sensitive to illumination from the back side, i.e. illumination entering from the bottom as oriented in FIG. 4, and can provide for hyperspectral imaging as described above with reference to FIGS. 1 and 2. The n-InP layer can have a thickness from below 200 nm, down to 10 nm thick.

The thinned InP cap/substrate in combination with AR coating improves quantum efficiency (QE) over the (visible and near infrared) Vis-NIR and SWIR range with enhanced spectral response, responsivity and sensitivity characteristics comparable to standard InGaAs, and can have excellent corrected uniformity across a broad part of a sensor's dynamic range.

The methods and systems of the present disclosure, as described above and shown in the drawings, provide for photodetectors with wide bandwidth hyper spectral sensitivity. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method comprising:
    forming an assembly of layers including growing an InP cap layer epitaxially on an InGaAs absorption region layer, wherein the InGaAs absorption region layer is on an n-InP layer, and wherein an underlying substrate layer underlies the n-InP layer; and
    removing a portion of the InP cap layer by dry etching, leaving a thickness of 10-99 nm of the InP cap layer, wherein the dry etching includes removing only on the order of nanometers of the InP cap layer.

2. The method as recited in claim 1, further comprising forming a dielectric passivation layer on the InP cap layer after removal of the portion of the InP cap layer by dry etching.

3. The method as recited in claim 2, further comprising forming a diffusion area in the InP cap layer and InGaAs absorption region layer to form a photodiode.

4. The method as recited in claim 3, wherein the dry etching is performed either on a front illuminated detector or a backside illuminated detector.

5. The method as recited in claim 1, wherein the dry etching includes inductive coupled plasma (ICP) etching.

6. The method as recited in claim 4, wherein the ICP is a chlorine free process.

7. The method as recited in claim 1, further comprising dry etching at least one of the InP cap layer or the n-InP layer down to a final thickness of 10 nm.

8. A method comprising:
    forming an assembly of layers including growing an InP cap layer epitaxially on an InGaAs absorption region layer, wherein the InGaAs absorption region layer is on an n-InP layer, and wherein an underlying substrate layer underlies the n-InP layer;
    removing a portion of the InP cap layer by dry etching, wherein the n-InP layer is a contact layer for a back side illuminated detector;

removing a portion of the substrate layer by chemical/mechanical polishing;

further selectively wet etching of the substrate layer; and dry etching a portion of the n-InP layer away down to a final thickness of 10 nm.

9. The method as recited in claim 6, wherein dry etching a portion of the n-InP layer away includes dry etching the n-InP layer down to a final thickness of less than or equal to hundreds of nanometers.

10. The method as recited in claim 6, further comprising forming a multiple layer backside anti-reflective coating on the n-InP layer.

11. A method comprising:

forming an assembly of layers including growing an InP cap layer epitaxially on an InGaAs absorption region layer, wherein the InGaAs absorption region layer is on an n-InP layer, and wherein an underlying substrate layer underlies the n-InP layer; and removing a portion of the InP cap layer by dry etching, wherein the dry etching includes dry etching the InP cap layer down to a thickness less than hundreds of nanometers that gives the assembly of layers sensitivity down into visible light wavelengths for hyper spectral imaging for front illumination.

* * * * *